(12) United States Patent
Tanaka

(10) Patent No.: US 7,547,624 B2
(45) Date of Patent: Jun. 16, 2009

(54) SEMICONDUCTOR DEVICE AND METHOD OF PRODUCING THE SAME

(75) Inventor: Yasuo Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 351 days.

(21) Appl. No.: 11/652,120

(22) Filed: Jan. 11, 2007

(65) Prior Publication Data

US 2007/0238289 A1   Oct. 11, 2007

(30) Foreign Application Priority Data

Apr. 7, 2006   (JP)   ............................. 2006-106237

(51) Int. Cl.
  *H01L 21/44* (2006.01)
(52) U.S. Cl. ................................ 438/612; 257/E23.021
(58) Field of Classification Search ......... 438/612–614, 438/692; 257/734, 737, 738, 780, 781, 784, 257/E23.021

See application file for complete search history.

(56) References Cited

U.S. PATENT DOCUMENTS 6,699,735 B2 *   3/2004   Ohuchi et al. ................ 438/113

FOREIGN PATENT DOCUMENTS

JP   2004-193488   7/2004

* cited by examiner

*Primary Examiner*—David Vu
(74) *Attorney, Agent, or Firm*—Kubotera & Associates, LLC

(57) ABSTRACT

A method of producing a semiconductor device includes the steps of forming a protrusion electrode on a semiconductor chip; and sealing the protrusion electrode and a semiconductor substrate with a resin layer. The method further includes the steps of polishing the resin layer until an upper surface of the protrusion electrode is exposed; polishing the exposed upper surface of the protrusion electrode; and forming a solder terminal on the polished upper surface of the protrusion electrode.

10 Claims, 4 Drawing Sheets

SEMICONDUCTOR DEVICE AND METHOD OF PRODUCING THE SAME

BACKGROUND OF THE INVENTION AND RELATED ART STATEMENT

The present invention relates to a semiconductor device, in particular, a semiconductor device having a protrusion electrode. The present invention also relates to a method of producing the semiconductor device.

In order to reduce a weight, thickness, length, or size of a semiconductor device, it has been required to reduce a width of a wiring pitch. In a conventional method of wiring a semiconductor circuit, a surface of a semiconductor substrate is polished with slurry containing a chemical reactive substance such as grinding particles (refer to Patent Reference).

Patent Reference: Japanese Patent Publication No. 2004-193488

In the method disclosed in Patent Reference, although it is possible to reduce a width of a wiring pitch, a metal portion of a semiconductor device tends to be susceptible to moisture due to impurities (acid) contained in slurry. Accordingly, it has been desired to develop a semiconductor device, while having a small width of a wiring pitch, having durability against moisture.

In view of the problems described above, an object of the present invention is to provide a semiconductor device having a small width of a wiring pitch and durability against moisture as well. Another object of the present invention is to provide a method of efficiently producing the semiconductor device.

Further objects and advantages of the invention will be apparent from the following description of the invention.

SUMMARY OF THE INVENTION

In order to attain the objects described above, according to the present invention, a method of producing a semiconductor device includes the steps of forming a protrusion electrode on a semiconductor chip; and sealing the protrusion electrode and a semiconductor substrate with a resin layer. The method of producing a semiconductor device further includes the steps of polishing the resin layer until an upper surface of the protrusion electrode is exposed; polishing the exposed upper surface of the protrusion electrode; and forming a solder terminal on the polished upper surface of the protrusion electrode.

In the method of producing a semiconductor device according to the present invention, after the protrusion electrode formed on the semiconductor chip is polished without using slurry, the upper surface thereof is further polished. Accordingly, it is possible to make the upper surface of the protrusion electrode smooth without using slurry. As a result, it is possible to obtain a semiconductor device having a small width of a wiring pitch and durability against moisture.

DETAILED DESCRIPTION OF PREFERRED EMBODIMENTS

Figure 1:
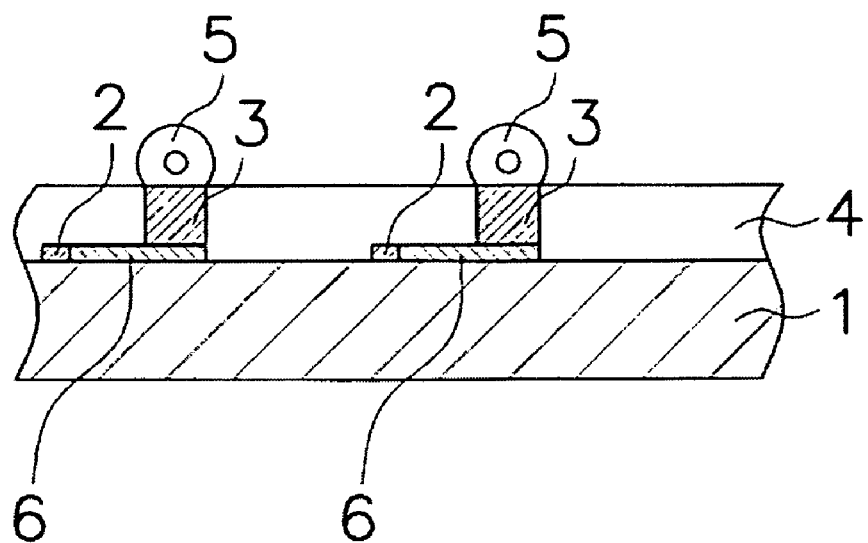
FIG. 1 is a schematic view showing a semiconductor device according to a first embodiment of the present invention.

Hereunder, embodiments of the present invention will be explained with reference to the accompanying drawings. FIG. 1 is a schematic view showing a semiconductor device 100 according to a first embodiment of the present invention. While the semiconductor device is a CSP (Chip Size Package) in the embodiments, the present invention is not limited thereto.

FIG. 1 shows a partially sectional view of the semiconductor device 100 including a semiconductor chip 1 and a semiconductor substrate. The semiconductor substrate may include, for example, a silicon substrate having a thickness of about 500 μm. As shown in FIG. 1, the semiconductor device 100 includes the semiconductor chip 1, metal pads 2, posts or protrusion electrodes 3, a resin layer 4, and solder terminals 5.

A plurality of metal pads 2 is arranged around a circumference of the semiconductor chip 1 with a specific interval. The posts 3 are formed on a main surface (upper surface in FIG. 1) of the semiconductor chip 1 with wirings 6 inbetween. The posts 3 are electrically connected to the metal pads 2 through the wirings 6. The posts 3 are formed of cupper and have a column shape. The posts 3 have a surface roughness of less than 30 nm (described later).

The resin layer 4 seals side surfaces 31 of the posts 3 and the main surface of the semiconductor chip 1. The resin layer 4 is formed of, for example, an epoxy resin.

A method of producing the semiconductor device 100 will be explained next with reference to FIGS. 2(a) to 2(e). FIGS. 2(a) to 2(e) are schematic views showing the method of producing the semiconductor device 100 according to the first embodiment of the present invention.

Figure 2A:
FIGS. 2(a) to 2(e) are schematic views showing a method of producing the semiconductor device according to the first embodiment of the present invention.

As shown in FIG. 2(a), first, the posts 3 are formed on the main surface of the semiconductor chip 1 on the semiconductor substrate with, for example, electric plating and the likes. More specifically, a logic circuit is formed on the main surface of the semiconductor chip 1, and the metal pads 2 (not shown in FIG. 2(a)) are formed around the circumference of the semiconductor chip 1. Afterward, an insulation layer (not shown) is formed over the main surface of the semiconductor chip 1 (upper surface in FIG. 2(a)) with, for example, photolithography and the likes. Then, re-wirings (corresponding to the wirings 6 in FIG. 1) are formed on the metal pads 2 and the insulation layer with, for example, a puttering method and the likes. Afterward, the posts 3 are formed at specific positions of the re-wirings. The posts 3 are formed of cupper with a metal plating method, and may be formed of aluminum, gold, silver, or platinum.

Figure 2B:
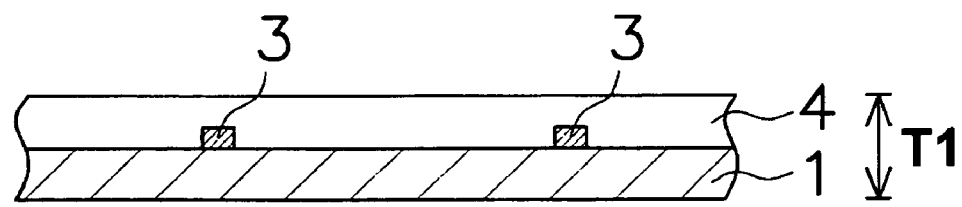

In the next step, as shown in FIG. 2(b), a resin is molded to form the resin layer 4 for sealing the main surface of the semiconductor chip 1 and the posts 3. The resin is molded through a method such as a transfer molding. Accordingly, the resin layer 4 is formed on upper surfaces of the posts 3. In the embodiment, a thickness T1 shown in FIG. 2(b) from an upper surface of the resin layer 4 to a lower surface of the semiconductor chip 1 is referred to as a mold thickness.

Figure 2C:
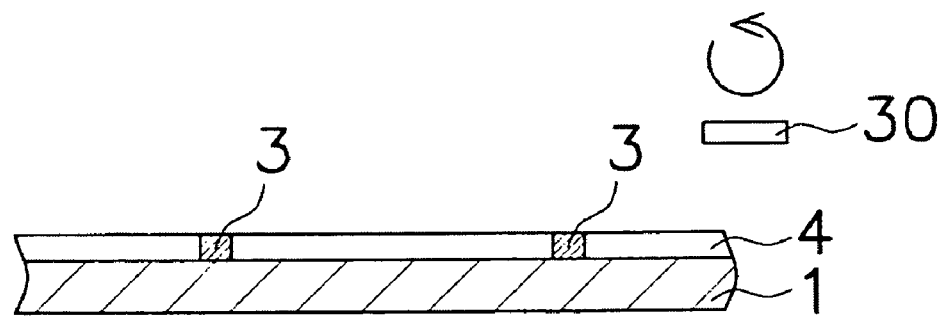

In the next step, as shown in FIG. 2(c), the upper surface of the resin layer 4 is polished with a grinding stone 30 until the upper surfaces of the posts 3 are exposed (first polishing). Table 1 shows polishing conditions. The first polishing is conducted until the upper surfaces of the posts 3 are exposed, that is, the posts 3 reach a predetermined height (described later).

TABLE 1

|  |  | One-axis (#325) | Two-axis (#600) |
|---|---|---|---|
| Grinding stone rotation |  | 2400 rpm | 3000 rpm |
| Grinding amount | 1st | molding thickness − (finish thickness + 30 μm) | 10 μm |
|  | 2nd | 20 μm | 10 μm |
| Grinding stone descending speed | 1st | 125 μm/min | 30 μm/min |
|  | 2nd | 50 μm/min | 15 μm/min |
| Stage rotation |  | 200 rpm | 120 rpm |

In the first polishing, two-stage polishing, i.e., one-axis polishing and two-axis polishing, is conducted as shown in Table 1. More specifically, in the one-axis polishing, the grinding stone 30 having a particle size of #325 is used, and in the two-axis polishing, the grinding stone 30 having a particle size of #600 is used.

Figure 2D:
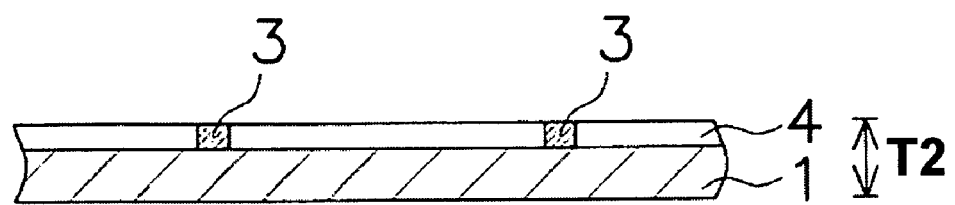

In the one-axis polishing, the resin layer 4 is polished with the grinding stone 30 having the particle size of #325 until the thickness of the resin layer 4 becomes a value calculated by subtracting a sum of a finish thickness and 30 μm from the molding thickness (1st condition in Table 1). The finish thickness is determined in advance, and is equal to a distance T2 from the lower surface of the semiconductor chip 1 to the upper surface of the resin layer 4 in a finished step, as shown in FIG. 2(d).

In this step, the grinding stone 30 rotates at 2400 rpm and descends at 125 μm/min, and a polishing stage rotates at 200 rpm. Then, the resin layer 4 is polished with the grinding stone 30 having the particle size of #325 by 20 μm (2nd condition in Table 1). In this step, the grinding stone 30 rotates at 2400 rpm and descends at 50 μm/min, and the polishing stage rotates at 200 rpm.

In the two-axis polishing, as shown in Table 1, the resin layer 4 is polished with the grinding stone 30 having the particle size of #600 by 10 μm. In this step, the grinding stone 30 rotates at 3000 rpm and descends at 30 μm/min, and a polishing stage rotates at 120 rpm (1st condition in Table 1). Further, the resin layer 4 is polished with the grinding stone 30 having the particle size of #600 by 10 μm. In this step, the grinding stone 30 rotates at 3000 rpm and descends at 15 μm/min, and a polishing stage rotates at 120 rpm (2nd condition in Table 1).

Through the first polishing, the posts 3 have a predetermined height (after the two-axis polishing under the 2nd condition). The upper surfaces of the posts 3 have a certain roughness (for example, 220 μm) at this point. In the embodiment, the grinding stones 30 having the particle sizes of #325 and #600 are used, and any grinding stone having a particle size between #300 and #1200 may be used.

In the next step, as shown in FIG. 2(d), the upper surfaces of the posts 3 are polished with a bit formed of single crystal diamonds until the surface roughness of the upper surfaces of the posts 3 becomes less than 30 nm (second polishing). Polishing conditions of the second polishing are shown in Table 2.

TABLE 2

|  | Conditions |
|---|---|
| Grinding stone rotation | 2000 rpm |
| Grinding amount | 3 μm |
| Work proceeding pitch | 20 μm/rev |
| Bit rake angle | 0° |

As shown in Table 2, the upper surfaces of the posts 3 and the resin layer 4 are polished under the conditions, in which the grinding stone 30 rotates at 2000 rpm, the work proceeding pitch is 20 μm/rev, and the rake angle of the bit is 0°. As a result, the surface roughness of the upper surfaces of the posts 3 becomes less than 220 nm, preferably less than 30 nm.

Figure 2E:
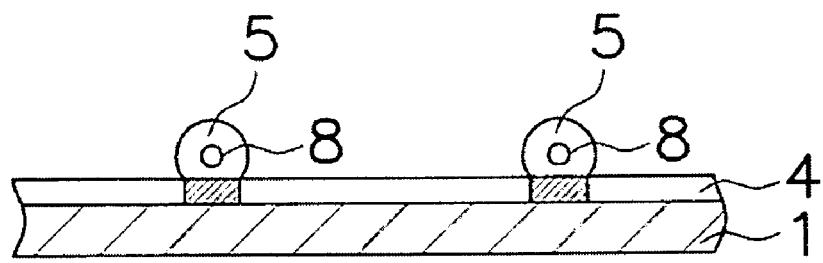

In the next step, as shown in FIG. 2(e), the solder terminals 5 are formed through a reflow process. In this step, since an oxide layer is formed in areas of the metal pads 2, the oxide layer is reduced to water vapor or carbon oxide gas during the reflow process. As a result, voids 8 may be generated in the solder terminals 5.

Afterward, the semiconductor substrate is cut with dicing to obtain the semiconductor device 100. At this moment, it is possible to seal a backside surface of the semiconductor device 100 with a resin.

Afterward, the semiconductor device 100 is mounted on a board such as a motherboard (not shown). In the mounting process, a thermal stress may be generated between the semiconductor device 100 and the board, so that a crack may propagate inward from connected portions of the solder terminals 5 with time. If the voids 8 are formed in the solder terminals 5, such a crack propagates at an accelerated speed. When the voids 8 have a large size, the voids 8 easily deform and the connected portions of the solder terminals 5 are easily disconnected.

Further, when the voids 8 have a large size, the solder terminals 5 have a small sectional area, thereby reducing strength of the solder terminals 5 and easily cracking the solder terminals 5. This phenomenon also occurs when the number of the voids 8 is large. That is, when the number of the voids 8 is large, the connected portions of the solder terminals 5 are easily disconnected. Further, the solder terminals 5 have a small sectional area, thereby reducing strength of the solder terminals 5.

An experiment was conducted, in which a product life of the semiconductor device 100 mounted on the board was measured while varying the surface roughness of the upper surfaces of the posts 3. The product life was defined as a life of board connection, i.e., electrical connection between the semiconductor device 100 and the board.

Figure 3:
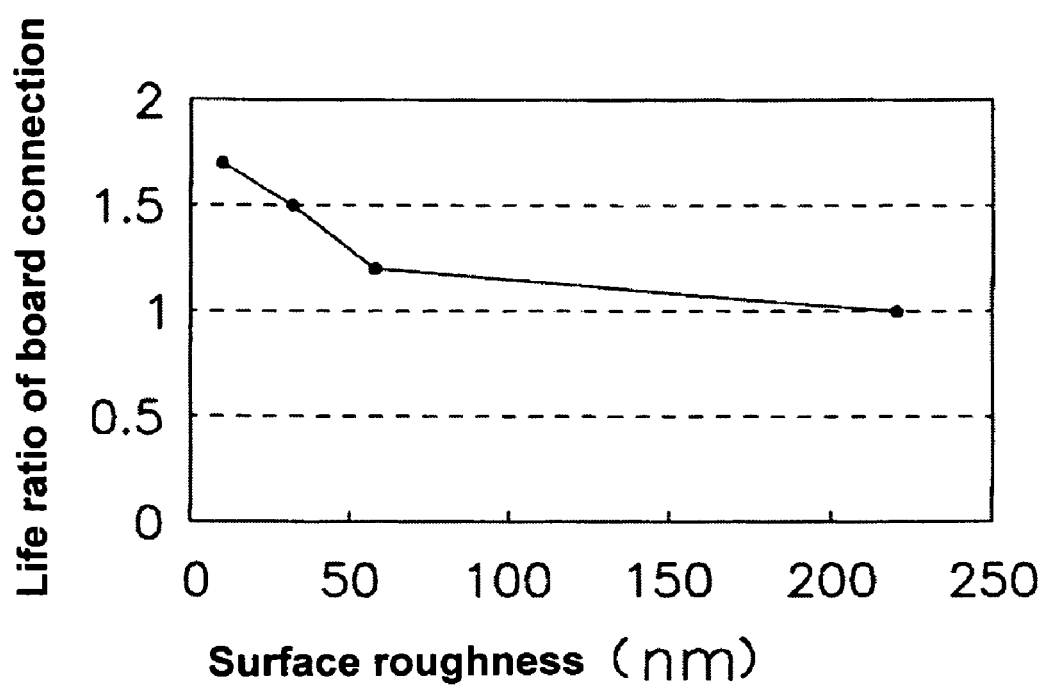
FIG. 3 is a chart showing a relationship between a roughness of an upper surface of a post and a board connection life.

In the experiment, the product life was measured by aging the semiconductor device 100 with varied surface roughness through four test conditions (accelerated condition). The four test conditions were 9 minutes at 125° C., 1 minute at 25° C., 9 minutes at −25°, and 1 minute at 25°. A result of the experiment is shown in FIG. 3.

TABLE 3

|  | Surface roughness (nm) | | | |
|---|---|---|---|---|
|  | 10 | 32 | 58 | 220 |
| Life ratio of board connection | 1.7 | 1.5 | 1.2 | 1.0 |

As shown in Table 3, when the surface roughness was 58 μm, the board connection life was 1.2 times longer than that in the case of the surface roughness of 220 nm. Further, when the surface roughness was 32 nm and 10 nm, the board connection life was 1.5 and 1.7 times longer than that in the case of the surface roughness of 220 nm, respectively.

FIG. 3 is a chart showing a relationship between the surface roughness of the upper surfaces of the posts 3 and the life ratio of the board connection. As described above, the surface roughness was varied between 0 nm and 220 nm. As shown in FIG. 3, the life ratio of the board connection increases as the surface roughness becomes smaller than 220 nm. That is, when the surface roughness decreases, reliability of the connection between the semiconductor device 100 and the board improves. From the result shown in FIG. 3, the surface roughness is preferably less than 30 nm.

When the surface roughness of the upper surfaces of the posts 3 decreases, surface areas of the upper surfaces of the posts 3 decreases. Accordingly, in the reflow process shown in FIG. 2(e), an amount of the oxide layer formed on the posts 3 decreases. As a result, an amount of water vapor or carbon oxide gas due to the oxide layer decreases, thereby reducing sizes of the voids 8 due to the water vapor and carbon oxide gas.

As described above, in the embodiment of the present invention, the semiconductor device is produced without using slurry used in the conventional method. Accordingly, it is possible to eliminate the negative influence of impurity (acid) generated from the slurry and improve durability of the metal portion against moisture.

Further, the surface roughness of the posts 3 becomes less than 30 nm, thereby extending the life of the board connection and improving the reliability of the board connection. Accordingly, it is possible to obtain the semiconductor device having a small width of a wiring pitch and durability against moisture.

The present invention is not limited to the embodiment described above, and various modifications are possible. For example, the protrusion electrode is provided as the post 3, and may be a bump. The protrusion electrode has the column shape, and may have any protruding shapes.

The disclosure of Japanese Patent Application No. 2006-106237, filed on Apr. 7, 2006, is incorporated in the application.

While the invention has been explained with reference to the specific embodiments of the invention, the explanation is illustrative and the invention is limited only by the appended claims.

What is claimed is:

1. A method of producing a semiconductor device, comprising the steps of:
    forming a protrusion electrode on a semiconductor chip;
    sealing the protrusion electrode and a semiconductor substrate with a resin layer;
    polishing the resin layer until an upper surface of the protrusion electrode is exposed; through a first polishing step using a rotational grinding stone under a first polishing condition and a second polishing step using the rotational grinding stone under a second polishing condition different from the first polishing condition;
    polishing the upper surface of the protrusion electrode; and
    forming a solder terminal on the upper surface of the protrusion electrode.

2. The method of producing a semiconductor device according to claim 1, wherein, in the step of polishing the resin layer, said resin layer is polished until surface roughness of the upper surface becomes less than 220 nm.

3. The method of producing a semiconductor device according to claim 1, wherein, in the step of polishing the upper surface, said upper surface is polished until surface roughness of the upper surface becomes less than 30 nm.

4. The method of producing a semiconductor device according to claim 1, in the step of polishing the resin layer, said rotational grinding stone is formed of particles having a particle size between #300 and #1000.

5. The method of producing a semiconductor device according to claim 1, in the step of polishing the upper surface, said upper surface is polished with diamond particles having a particle size finer than #2000.

6. The method of producing a semiconductor device according to claim 1, in the step of forming the protrusion electrode, said protrusion electrode is formed of cupper.

7. A semiconductor device being produced with the method according to claim 1.

8. The semiconductor device according to claim 7, wherein said upper surface of the protrusion electrode has surface roughness of less than 30 nm.

9. The semiconductor device according to claim 7, further comprising a sealing layer for sealing a side surface of the protrusion electrode and a main surface of the semiconductor substrate.

10. The semiconductor device according to claim 7, wherein said protrusion electrode is formed of cupper.

* * * * *